US006578178B2

United States Patent
Mau

(10) Patent No.: US 6,578,178 B2
(45) Date of Patent: *Jun. 10, 2003

(54) DESIGNING INTEGRATED CIRCUITS TO REDUCE ELECTROMIGRATION EFFECTS

(75) Inventor: Hendrik T. Mau, Santa Clara, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/949,068

(22) Filed: Sep. 7, 2001

(65) Prior Publication Data

US 2003/0066036 A1 Apr. 3, 2003

(51) Int. Cl.[7] .............................................. G06F 17/50
(52) U.S. Cl. .................................. 716/2; 716/4; 716/5
(58) Field of Search ...................... 716/1–5, 18; 703/18

(56) References Cited

U.S. PATENT DOCUMENTS

| 5,349,542 A | * | 9/1994 | Brasen et al. | ................. | 703/15 |
| 5,822,218 A | * | 10/1998 | Moosa et al. | ................... | 716/4 |
| 5,995,732 A | * | 11/1999 | Murai | ........................... | 716/5 |
| 6,311,147 B1 | * | 10/2001 | Tuan et al. | .................... | 703/18 |

OTHER PUBLICATIONS

*Statistical Electromigration Budgeting for Reliable Design and Verification in a 300–MHz Microprocessor*, by John Kitchin, 1995 Symposium on VLSI Circuits, Digest of Technical Papers, pp. 115 and 116.

*A Statistical Approach to Electromigration Design for High Performance VLSI*, by John Kitchin and T.S. Sriram, Fourth International Workshop @ 1998 The American Institute of Physics, pp. 495–504.

* cited by examiner

*Primary Examiner*—Matthew Smith
*Assistant Examiner*—Paul Dinh
(74) *Attorney, Agent, or Firm*—Hamilton & Terrile LLP; Stephen A. Terrile

(57) ABSTRACT

A method of designing an integrated circuit calculates the current density in each metal lead. The method can calculates a mean time to failure for at least one metal lead. The method can assume the metal leads are arranged in series only. The method can calculate the reliability of the integrated circuit. The method can arrange the set of metal leads by reliability. The method can divide the set of metal leads into at least two subsets, a subset requiring redesign and a subset meeting the reliability criteria. An embodiment includes an integrated circuit designed by the method taught. An embodiment includes a computer program product according to the method taught. An embodiment includes an integrated circuit including an integrated circuit designed according to the computer program product.

48 Claims, 13 Drawing Sheets

DESIGNING INTEGRATED CIRCUITS TO REDUCE ELECTROMIGRATION EFFECTS

CROSS-REFERENCE TO RELATED APPLICATIONS

This application relates to co-pending U.S. patent application Ser. No. 09/949,067, attorney docket number SP-6455 US, filed on a date even herewith, entitled "Designing Integrated Circuits to Reduce Temperature Induced Electromigration Effects" naming Hendrik T. Mau as inventor, which is assigned to the assignee of this application, the application being hereby incorporated herein by reference in its entirety.

BACKGROUND OF THE INVENTION

1. Field of the Invention

The present invention relates to designing integrated circuits to increase reliability. More specifically, the present invention relates to designing integrated circuits to reduce failures due to electromigration.

2. Description of the Related Art

The reliability of recent very large scale integration (also referred to as "VLSI") designs has been improved through better alloys, additional layers and increasing grain size. However, designers continue to have aggressively pursue increased product performance. Pursuing increased performance leads to higher clock speeds and power dissipation, which increase thermal density and thermal stress. High current densities and thermal stresses drive degradation mechanisms in the interconnect system of VLSI circuits. Specifically, high current densities lead to electromigration-caused failures.

Electromigration (also referred to as "EM") is an atomic diffusion phenomenon and refers to the transport of ions or atoms due to the high current densities and/or strong electric fields. FIG. 1A illustrates the mechanics of electromigration. As shown in FIG. 1A, electric current leaves the metal strip at the anode and is conducted to the cathode. The electrical current causes metal particles to migrate from the cathode side of the strip to the anode side of the strip. By definition, the electrical current is in the opposite direction to the electron flow. Thus, metal particles deplete the cathode side of the metal strip and accumulate on the anode side. Depletion of the cathode side can cause voids which can cause an open circuit. Accumulation on the anode side can lead to a hillock which can cause a short circuit. Thus, both accumulation and depletion can cause failure of a microprocessor or other integrated circuit.

Referring briefly to FIG. 2, an equation is provided to calculate the outgoing atomic flux per unit volume, referred to as the volumetric generation rate ($\nabla \cdot \vec{J}_A$). As illustrated in FIG. 2, the equation can be used to calculate the volumetric generation rate due to a structural inhomogeneity, a temperature inhomogeneity, a current density inhomogeneity or a material inhomogeneity. For example, current density inhomogeneity can be caused by two imposed currents on a single metal lead with a single anode and a single cathode. Flux divergence is the difference between flux received and flux transmitted. In structural inhomogeneity, flux is not transmitted evenly due to voids or other structural imperfections in the metal lead. The depletion and accumulation regions are not bound to the cathode or anode. These processes take place wherever an inhomogeneity causes a volumetric generation rate greater than zero.

FIG. 2 also depicts temperature inhomogeneity. The temperature inhomogeneity leads to an inhomogeneous atomic flux distribution which causes areas of depletion and accumulation of atoms. Finally, FIG. 2 also represents the inhomogeneity due to mature constants. An inhomogeneity in the flux can be caused by an inhomogeneity of material constants. For example, inhomogeneity due to constants such as conductivity and diffusivity. These constants can be due to barrier layers between metals such as aluminum and copper in the metal lead.

As previously discussed (refer to FIG. 1A), the transport of ions or atoms causes degradation and failure of metal connections in an integrated circuit. Thus, EM has remained a key variable in the design of integrated circuits. Designers compare interconnect direct charge average current per unit width, $J'_{eff}$, to a fixed limit. For example:

$$S = \frac{\text{Actual } J'_{eff}}{\text{Design Limit } J'_{eff}}$$

where:
S represents current density ratio
$J'_{eff}$ represents electrical current density per unit width in amps per centimeter With appropriate modifications for contacts and alternating current lines the equation given above can be used to provide a conservative fixed limit. Previously, designers considered a design with S<1 a reliable design. Typically, designs producing S>1 have been subject to redesign.

However, from a reliability perspective, EM is inherently statistical. Failure times can vary widely for identically sized and stressed interconnects. An approach that factors EM failure statistics into the setting of EM design limits does not quantify chip reliability and does not reveal the relationship between S and EM risk. When reliable design is defined to mean achieving a chip-level reliability goal, fixed current density design limits become mathematically arbitrary. A design which has all interconnects to satisfy S<1 does not guarantee a reliable design. Similarly, a design including an interconnect with S>1 does not necessarily lead to an unreliable product. The total statistical risk is the critical variable in the design. Therefore, if each segment of interconnect at each stress level can be evaluated, the reliability goal can be distributed between interconnections. Distributing the reliability goal among classes of interconnections minimizes the performance limitation that an EM reliability goal places on the design.

Table 1 (below) demonstrates a typical non-linear relationship between maximum allowed current density and the number of violation corrections needed to reduce the current density below the allowable limit for a specific design.

TABLE 1

| Current Density Limit [amps/sq. cm] | Number of Violations |
| --- | --- |
| 3.17E6 | 9 |
| 2.58E6 | 17 |
| 2.10E6 | 52 |
| 1.71E6 | 97 |
| 1.39E6 | 162 |
| 1.13E6 | 337 |
| 0.93E6 | 616 |

Table 1 demonstrates that nine leads in the integrated circuit block must be redesigned (by widening the lead or other modification) to satisfy the current density limit of $3.17 \times 10^6$ amps per square centimeter. Similarly, for a current density of $2.58 \times 10^6$ amps per square centimeter, seventeen leads in the hypothetical integrated circuit block must be redesigned. Thus raising the allowable current density limit from $2.58 \times 10^6$ amps per square centimeter to $3.17 \times 10^6$ amps per square centimeter decreases from seventeen to nine the number of violations which must be addressed.

Still referring to Table 1, for a current density of $0.93 \times 10^6$ amps/cm$^2$, 616 violations must be corrected before the current density design limit is satisfied. Thus, increasing the allowable current density design limit from $0.93 \times 10^6$ to $3.17 \times 10^6$ amps/cm$^2$ decreases the number of violations which must be satisfied from 616 violations to nine violations. Thus, the case illustrated by Table1 shows that for an increase in the current density limit of approximately four times, the number of violations that must be corrected is reduced by over 98%, a non-linear relationship. A preliminary VLSI design can have 2.1 million violations or more. Thus, increasing the allowable current density limit can have a significant impact on the number of potential violations to be addressed in a redesign.

FIG. 1B is a graph of the number of interconnects versus the current density distribution. As shown in FIG. 1B (and as previously noted in Table 1), the relationship between the number of interconnects and the current density distribution is non-linear. Thus, an increase in the allowable current density can be expected to disproportionately lower the number of violations.

The relation between the divergence of atomic flux and the time to failure can be modeled mathematically. FIG. 3 shows the probability distribution function of the time to failure as a lognormal distribution. Thus, FIG. 3 shows the probability of failure at a given time. The area under the curve is normalized to one so that the percentage of failed devices can be calculated by integrating the area under the curve from time to failure equal zero (TTF=0) to the time of interest.

The percentage of failed devices at a given time based on the probability distribution function of the time to failure can also be estimated. FIG. 4 shows the cumulative distribution function in conjunction with the probability distribution function. The cumulative distribution function (CDF) defines the percentage of failed devices as a function of time. Based on the CDF the reliability can be calculated at a given time.

Data from accelerated testing are often used to estimate the failure distribution of each class of interconnect structures. Testing is accelerated using higher currents and temperatures than normal operating conditions. Often, the mode of failure in the accelerated test is assumed to be the same (or similar) to the failure mode under normal operating conditions. The failure distribution can be extrapolated for normal operations. Computer aided design tools determine the relative current stress $S_y$ and temperature acceleration factor $A_y$ at worst case operating conditions.

Designers can permit a certain number of connections which do not satisfy the reliability goal. Designing a circuit including a connection with greater than the current density design limit is known as "waiving an error" or "waiving a violation." What is needed is a method to determine the number of violations which can be waived without reducing the reliability for the integrated circuit.

SUMMARY OF THE INVENTION

The interconnect system of layouts of VLSI designs are analyzed with respect to the electromigrations risk in order to ensure a reliable design. The electromigration risk is directly proportional to the current density limit which can be obtained from simulations for the metal lead and via system. The method taught uses the current density distribution over the interconnect system to determine the number of interconnects which must be redesigned in order to meet the reliability criteria. The method taught can also identify the interconnects subject to redesign to meet the reliability criteria sought.

Thus, based on the reliability goal for the entire design specific, reliability levels will be assigned to blocks or parts of the design. After the layout phase the design of these blocks can be analyzed according to the method taught. Based on simulations, calculated current densities can be compared to a current density limit. If the current density exceeds the current density limit the interconnect is identified for redesign. The method allows analysis of part of a design and does not require analysis of an entire design.

In order to determine the number of violations which need to be addressed, a tool performs an analysis assuming the violations above a certain level have been addressed. Based on the number of violations which have been addressed, the method can calculate a new reliability. If the reliability is below the reliability criteria, the level of which violations have to be fixed will be lowered and the process starts again until the given reliability criteria is met. Therefore, the output is a specific list identifying the interconnect portions which are to be redesigned to meet the reliability criteria. The method can also identify an approximate amount by which to widen a metal lead to meet the desired reliability criteria.

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The following sets forth a detailed description of a mode for carrying out the invention. The description is intended to be illustrative of the invention and should not be taken to be limiting. As previously mentioned, metal particles migrate from cathode to anode by EM. The migration causes an area of depletion. The area of depletion is a cause of failure. EM is a function of atomic flux density which is given by:

$$\vec{J}_A = C\frac{D(T)}{k_B T}\vec{F} = \frac{\alpha}{\kappa}\frac{D(T)}{k_B T}\vec{J} \qquad \text{Equation 1}$$

where:

$\vec{J}_A$ is the atomic flux density

C is a concentration of metal atoms

α is a pre-factor which can include physical constants

κ represents the electrical conductivity of the metal lead $k_B$ is the Boltzman constant $\vec{F}$ is a driving force in the diffusion process T is temperature $\vec{J}$ is electrical current density D(T) is a temperature dependent diffusion constant
where:

$$D(T) = D_o e^{\frac{E_A}{k_B T}}$$

Figure 1A:
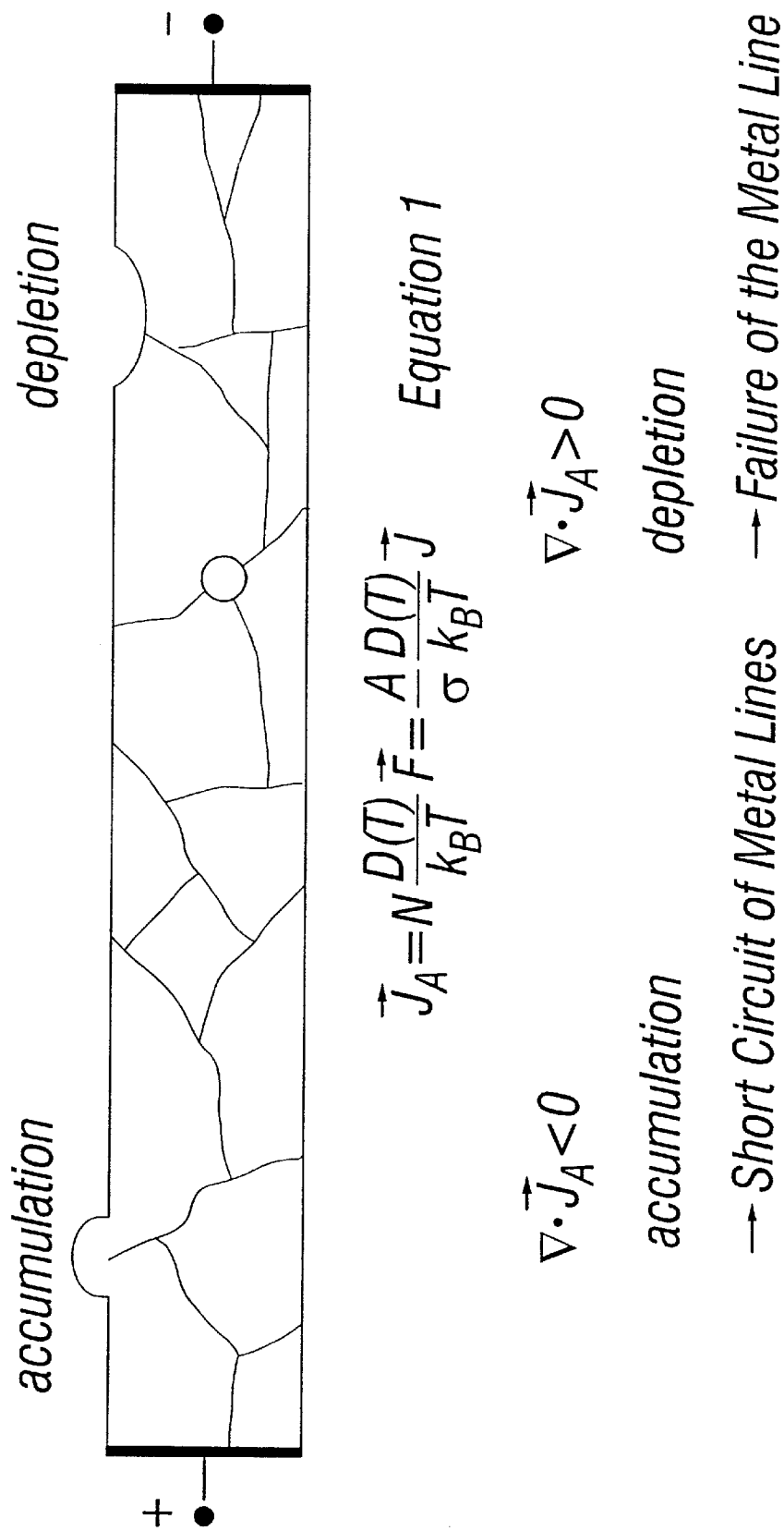
FIG. 1A depicts the particle mechanics of electromigration from an anode to a cathode.
Figure 1B:
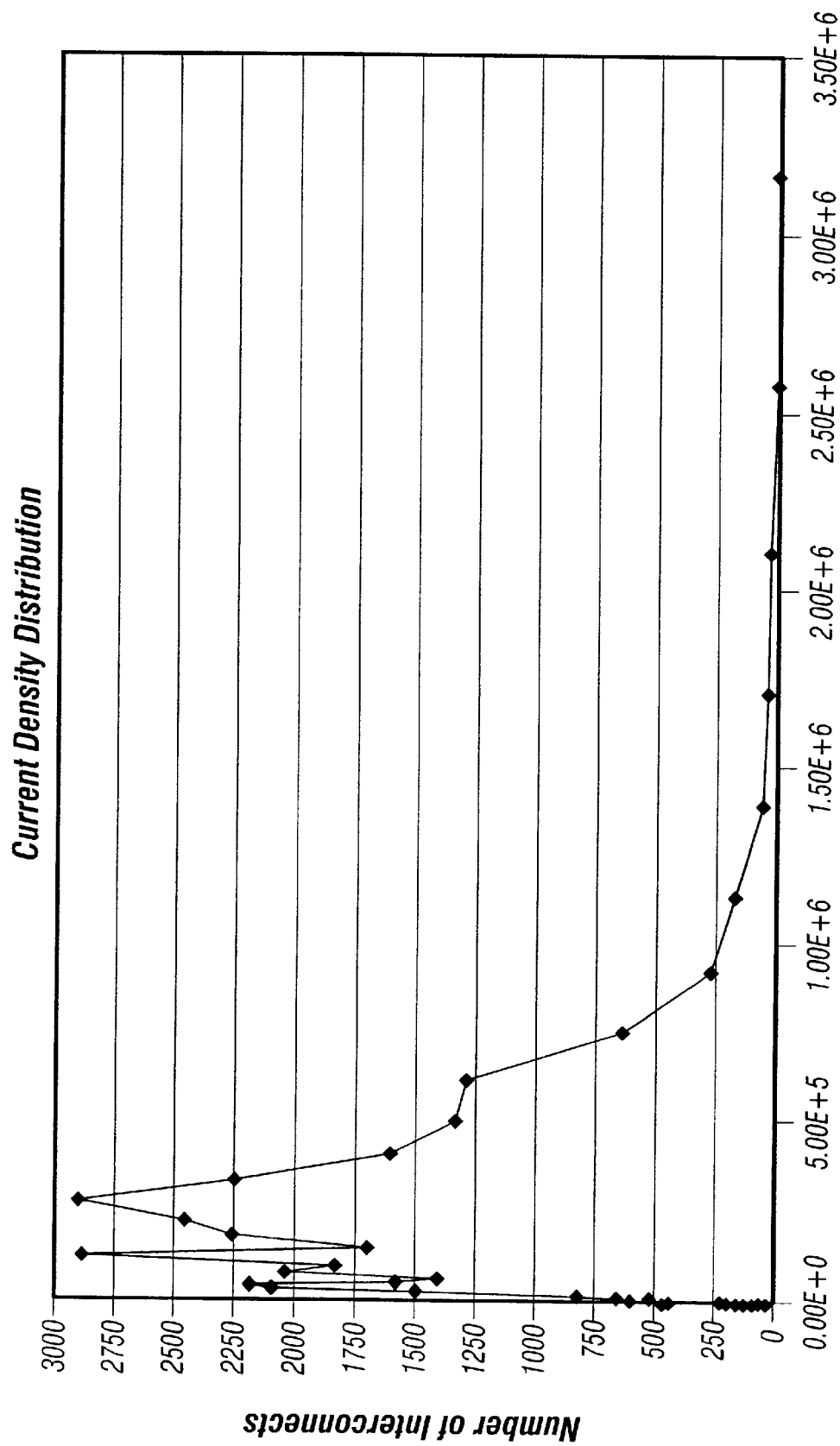
FIG. 1B depicts a graph of number of interconnects versus current density for a typical circuit.
Figure 2:
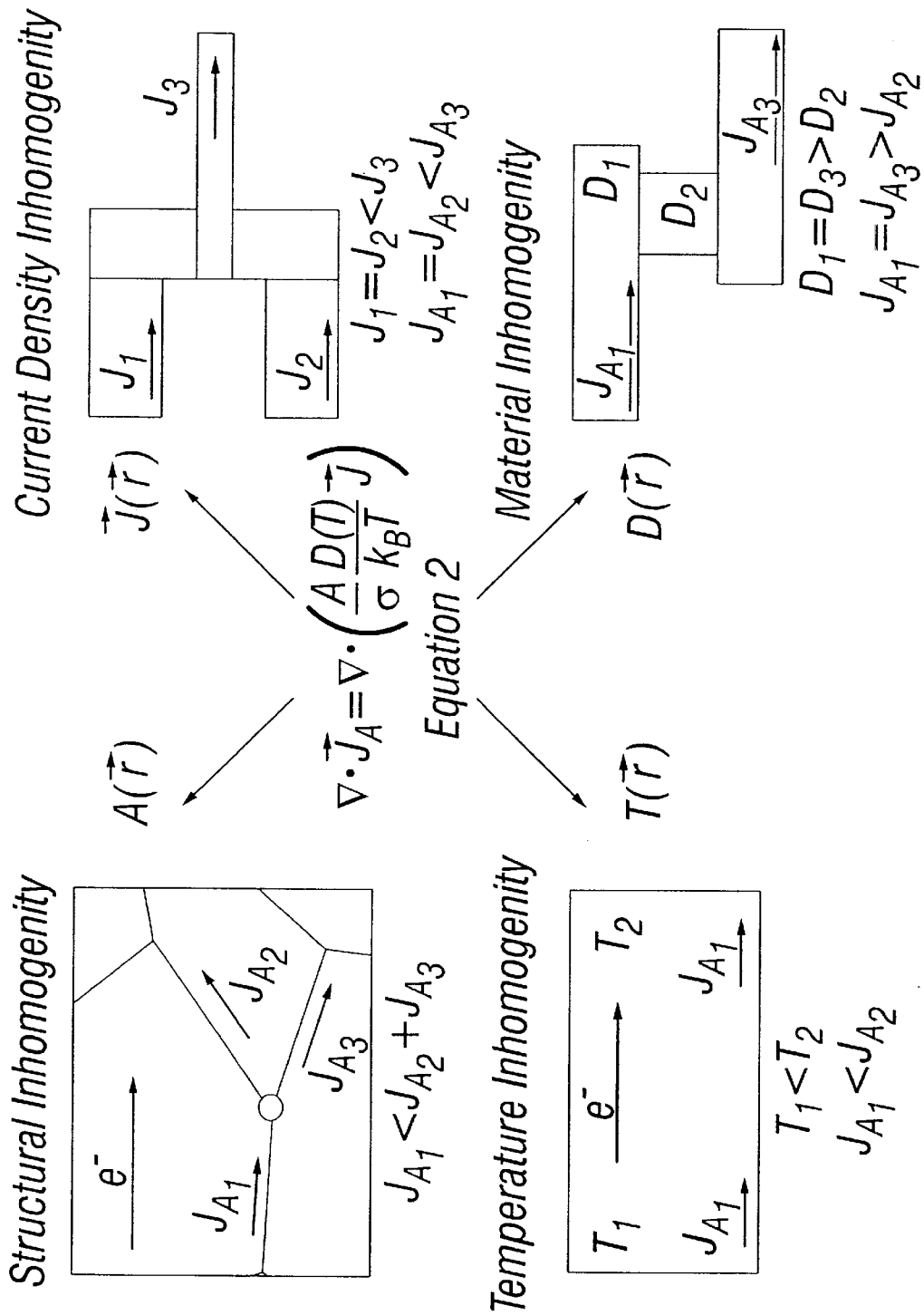
FIG. 2 depicts application of a current flux calculation to current density inhomogeneity, a material inhomogeneity, a structural inhomogeneity and temperature inhomogeneity.
Figure 3:
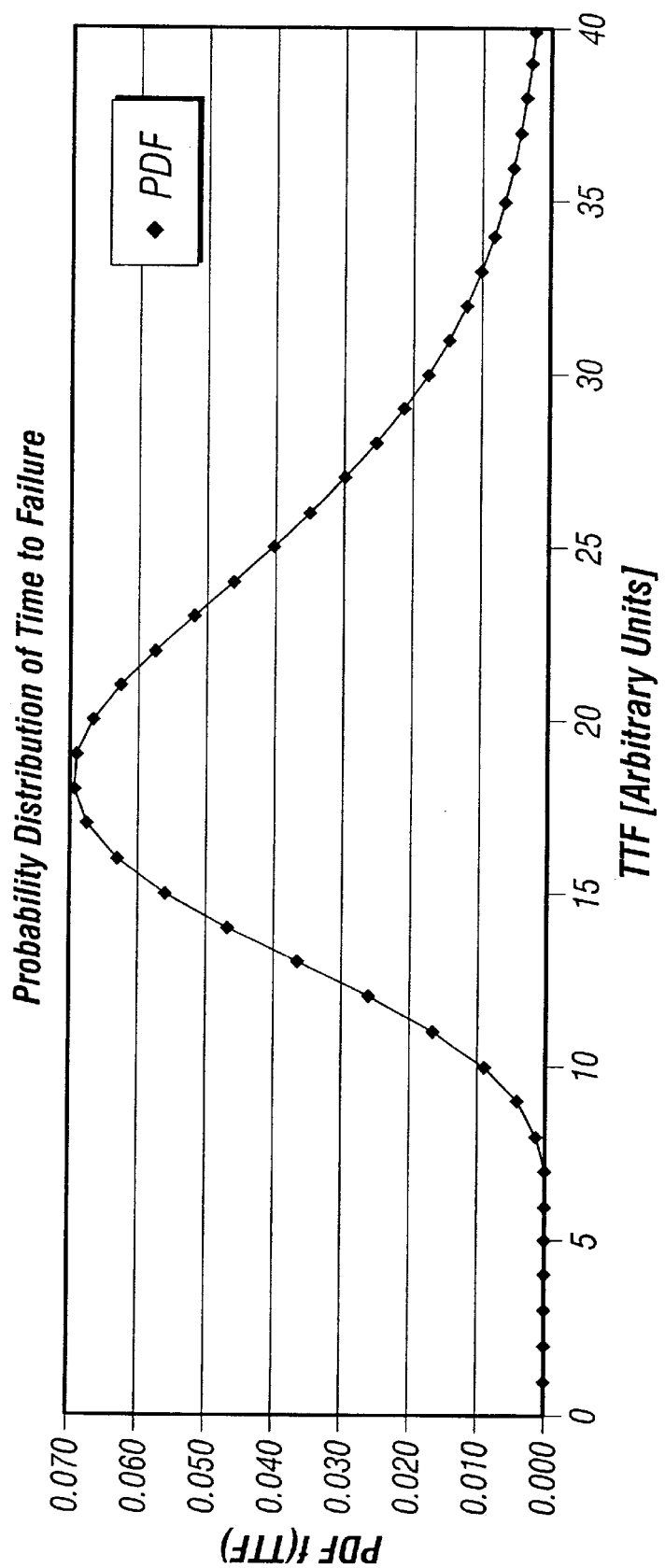
FIG. 3 depicts a plot of the probability distribution of the time to failure of a typical interconnect system.
Figure 4:
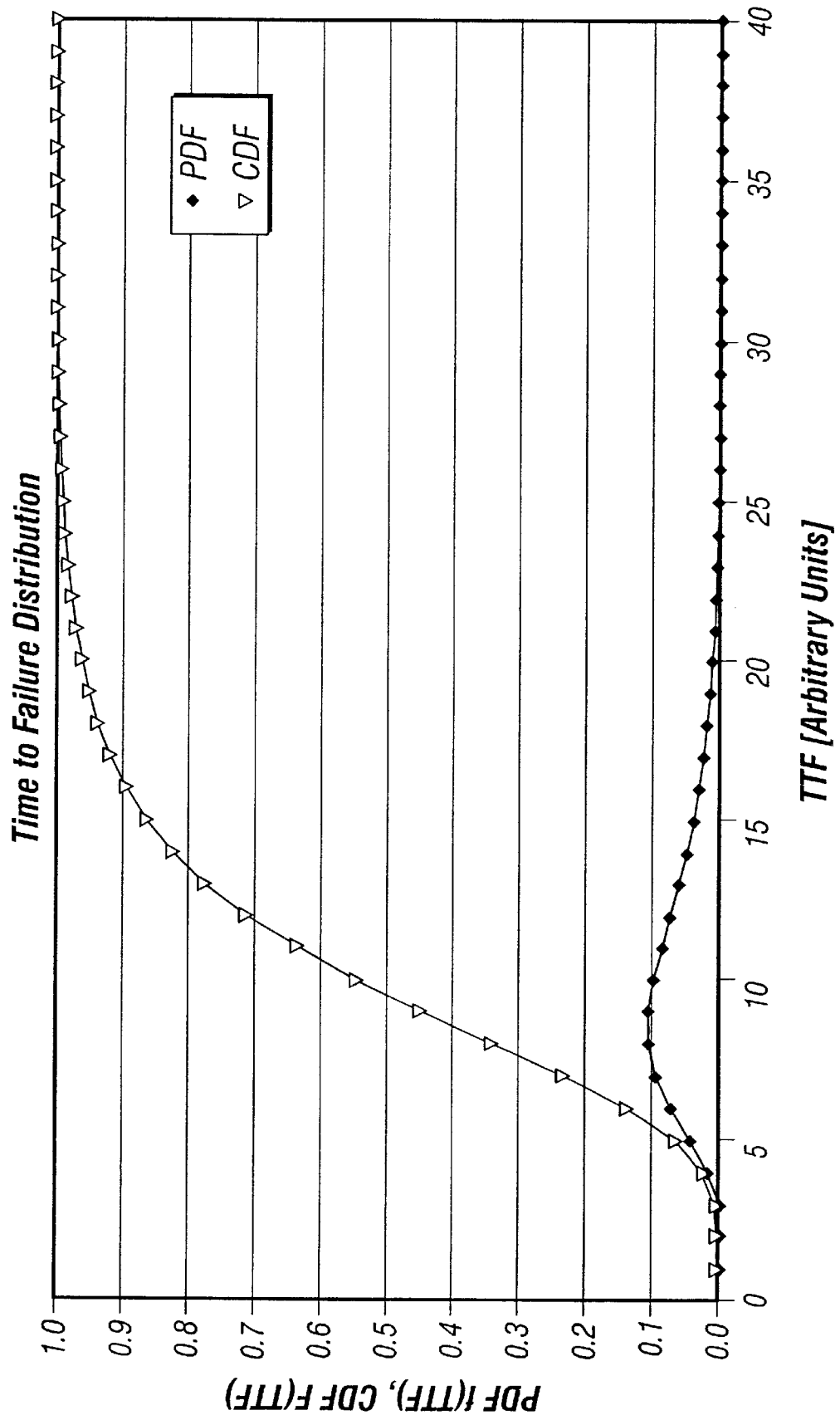
FIG. 4 depicts the relationship between the probability of failure (PDF) at a certain time and the number of connects which will fail at this time.

$D_o$ is a material dependent diffusion constant $E_A$ represents the activation energy Differences in current flux due to structure, current density, temperature and mature constants is mathematically defined as:

$$\nabla \cdot \vec{J}_A = \nabla \cdot \frac{\alpha}{\kappa}\frac{D(T)}{k_B T}\vec{J} \qquad \text{Equation 2}$$

where:

$\nabla \cdot \vec{J}_A$ is the outgoing atomic flux per unit volume

α is a pre-factor, includes physical constants

κ represents the electrical conductivity of the metal lead $k_B$ is the Boltzman constant D(T) is a temperature dependent diffusion coefficient T is temperature $\vec{J}$ is electrical current density From Equation 2, it follows that:

$$\nabla \cdot \vec{J}_A = \frac{dC}{dt} \qquad \text{Equation 3(a)}$$

where:

$\nabla \cdot \vec{J}_A$ is the outgoing atomic flux per unit volume dC represents an incremental change in concentration of atoms or ions dt represents an incremental change in time FIG. 2 shows atomic flux divergence as produced by structural inhomogeneity, current density inhomogeneity, temperature inhomogeneity and material inhomogeneity. Equation 3(a) can be used to define the atomic flux divergence as shown in the as shown in FIG. 2, but Equation 3(a) is not limited and can be used to calculate the atomic flux under circumstances other than those shown.

The time to failure for one given metal lead can be estimated by Equation 3(b) below:

$$TTF(T, J) = t_{fail} = \frac{C_{critical} - C_o}{\frac{dC}{dt}} \qquad \text{Equation 3(b)}$$

Assuming a constant rate of dC/dt, Equation 3(b) gives the time to failure for a metal lead having initial concentration of metal $C_o$. The time to failure is the time from $C_o$ to $C_{critial}$ and represents the time that a certain metal lead will fail. For processes that degrade over time, eventually reaching a failure state, one can use the lognormal distribution, as shown in Equation 3(c) below to describe the distribution of TTF's for a set of similar metal leads.

$$f(t) = \frac{1}{\sigma t\sqrt{2\pi}} e^{-\frac{1}{2\sigma^2}[\ln(t)-\ln(t_{50})]^2} \qquad \text{Equation 3(c)}$$

Where:

σ represents the standard deviation t represents time $t_{50}$ is the median time to failure e represents the natural log Equation1 to Equation 3(c) model the mean time to failure as a function of the current density and the temperature. Alternatively, the mean time to failure can be calculated using Black's equation. Black's equation (see Equation 3(d) below) is used in conjunction with the lognormal distribution to calculate the mean time to failure for a specific metal lead depending on temperature and the current density.

$$MTTF(T, J) = \frac{A}{J^n} e^{\frac{E_A}{k_B T}} \qquad \text{Equation 3(d)}$$

A represents a pre-exponential factor

J represents current density

T represents temperature $k_B$ is the Boltzman constant

J represents current density n represents the current density exponent

Black's equation simplifies the calculation of the mean time to failure using data which can be obtained from experiments. Using Black's equation, it is possible to extrapolate from the condition of the accelerated tests to the operating conditions. For example, activation energy ($E_A$) and current density exponent (n) can be obtained by experimental observation.

Based on the failure rate over time given by Equation 3(c), the percentage of failed devices at time t can be obtained by integrating. This integration, as shown in Equation 4(a) below, provides the cumulative failure distribution.

$$CDF=F(t) \qquad \text{Equation 4(a)}$$

Based on the percentage of failed devices at a specific time (t), given by F(t), one can calculate R(t) (the probability of surviving until time t) by Equation 4(b), below:

$$R(t)=1-F(t) \qquad \text{Equation 4(b)}$$

Equation 1 to Equation 4(b), as previously introduced, are used to calculate the reliability of one metal lead. However, the system reliability depends on the reliability of all metal leads which is represented by the chain of dependency given in Equation 5.

$$MTTF_i(J,T) \rightarrow F_i(t) \rightarrow R_i(t) \rightarrow R(t) \quad \text{Equation 5}$$

$F_i(t)$ represents cumulative failure of the interconnect at time t $R_i(t)$ represents reliability of one interconnect $R(t)$ represents the reliability of the complete system of interconnects By using Black's equation (refer to Equation 3(d)) the chain of dependency represented by Equation 5 can be extended. The chain of dependency now provides the relationship between the current densities in the set of metal leads and the system reliability. Mean time to failure is dependent on current density and temperature.

$$\frac{A}{J_i^n} e^{\frac{E_A}{k_B T}} = MTTF_i(J,T) \rightarrow F_i(t) \rightarrow R_i(t) \rightarrow R(t) \quad \text{Equation 6}$$

Equation 6 illustrates the relationship between the mean time to failure based on the chain of dependency. The reliability of the system depends on the reliability of an item which depends on the probability of failure of the item.

Figure 5:
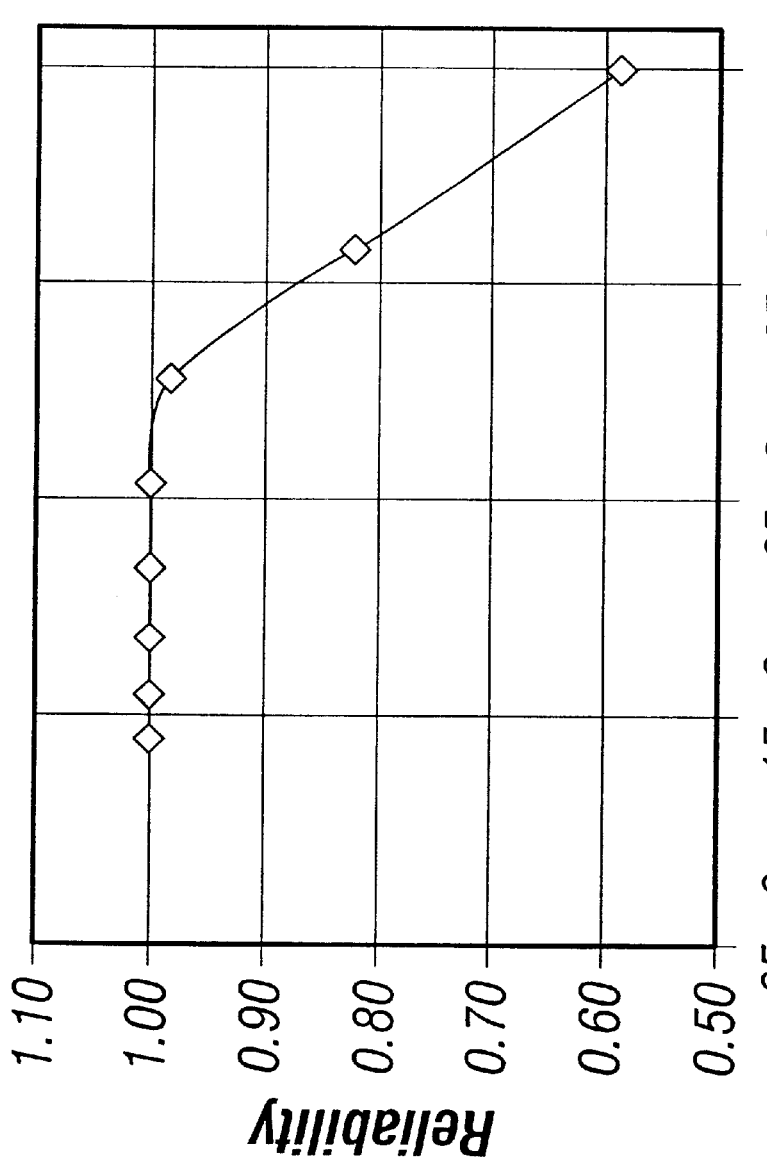
FIG. 5 depicts an increase in the reliability of a system due to a decrease in the maximum current density in the design.

FIG. 5 shows the relationship between the CDF and current density. If the current limit is reduced the CDF decreases at a given time. As shown in FIG. 5, decreasing the current limit increases the reliability. Therefore, if a maximum acceptable current limit decreases then the reliability of the system increases. However, current density can vary over time. As shown in Equations 7(a)–7(c), time varying current density can be used to calculate mean time to failure. Equation 7(c) provides an approximation of the mean time to failure based for a time dependent current density. An algorithm such as Equation 7(c) can be used to predict time to failure for a system having interconnects with varying current density. An algorithm such as Equation 7(c) is particularly applicable to a software solution.

$$factor' = \left[1 + \frac{A_{DC}(|\bar{J}| - \bar{J})}{A_{AC}\bar{J}}\right] \quad \text{Equation 7(a)}$$

$$factor'' = \frac{1}{J} \quad \text{Equation 7(b)}$$

$$MTTF = (1/factor')(factor'')\frac{A_{DC}(T)}{|J^{m-1}|} \quad \text{Equation 7(c)}$$

where:

$A_{AC}$ represents a prefactor for alternating current $A_{DC}$ represents a prefactor for direct current $$MTTF = \frac{A}{J^2} e^{\frac{E_A}{k_B T}} \quad \text{Equation 8(a)}$$

Equation 8(a) is similar to Equation 3(d), however the exponential in Equation 3(d) has been replaced with an exponent of two, which is used for aluminum. Aluminum is often used as the conductor in integrated circuits such as microprocessors. Hence Equation 3(d) is commonly used in the form represented in Equation 8(a).

$$T = T_{substrate} + \frac{J_{rms}^2}{\kappa} A_q R_{thermal} \quad \text{Equation 8(b)}$$

$T_{substrate}$ represents the substrate temperature $A_q$ represents the cross-sectional area of the metal lead $\kappa$ represents the electrical conductivity of the metal lead $R_{thermal}$ represents thermal resistance between metal lead and substrate Equation 8(b) represents the temperature of the metal lead in the integrated circuit package. Equation 8(b) allows calculation of the increase in temperature between the metal lead and the silicon die. Thus, in many operating conditions the temperature of the metal lead will be higher than the temperature of the die due to the self-heating effect. Equation 8(b) corrects the temperature of the metal lead to include the thermal effect of the substrate.

Figure 6:
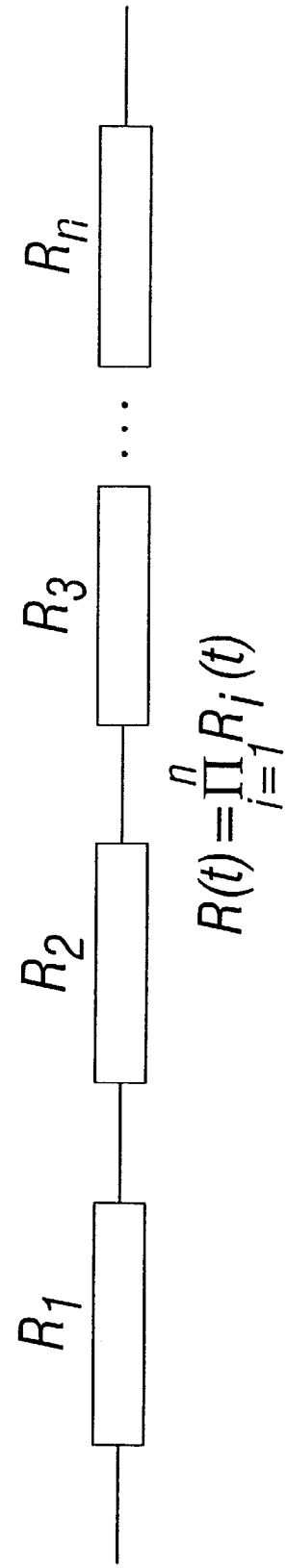
FIG. 6 depicts an assumption used to calculate reliability of the system, each metal lead connected in parallel.

Referring to FIG. 6 a representation of a series system is shown. Each component, ($R_1$, $R_2$, $R_3$ to $R_N$) is directly connected to the preceding component. In the event of a series system the reliability is the product of the reliability of all components, as represented by Equation 9:

$$R(t) = \pi_{i=1}^{N} R_i(t) \quad \text{Equation 9}$$

According to the assumption made in Equation 9, if one interconnect fails, then the system fails. In the case of an electrical system in a series configuration, if one interconnect fails then the system fails. Based on this assumption, there are no alternate paths in the system. Without alternate paths, failure of any connection leads to a failure of the system. Using the assumption of a series system, Equation 9 allows calculation of the reliability of the system based on the reliability of the metal leads.

The method above can be used to facilitate the design of an integrated circuit, such as a VLSI integrated circuit, or microprocessor. As depicted in FIGS. 7A–D, the method determines an acceptable current density for a metal lead, step 705. The method also determines an acceptable reliability for an integrated circuit, step 704. From steps 704 and 705, the method next provides a first design for an integrated circuit, step 710. From step 710, the method determines a first current density for the (first) set of metal leads, step 715. From step 715, the method determines a (first) subset of the first set of metal leads, step 720.

Figure 7A:
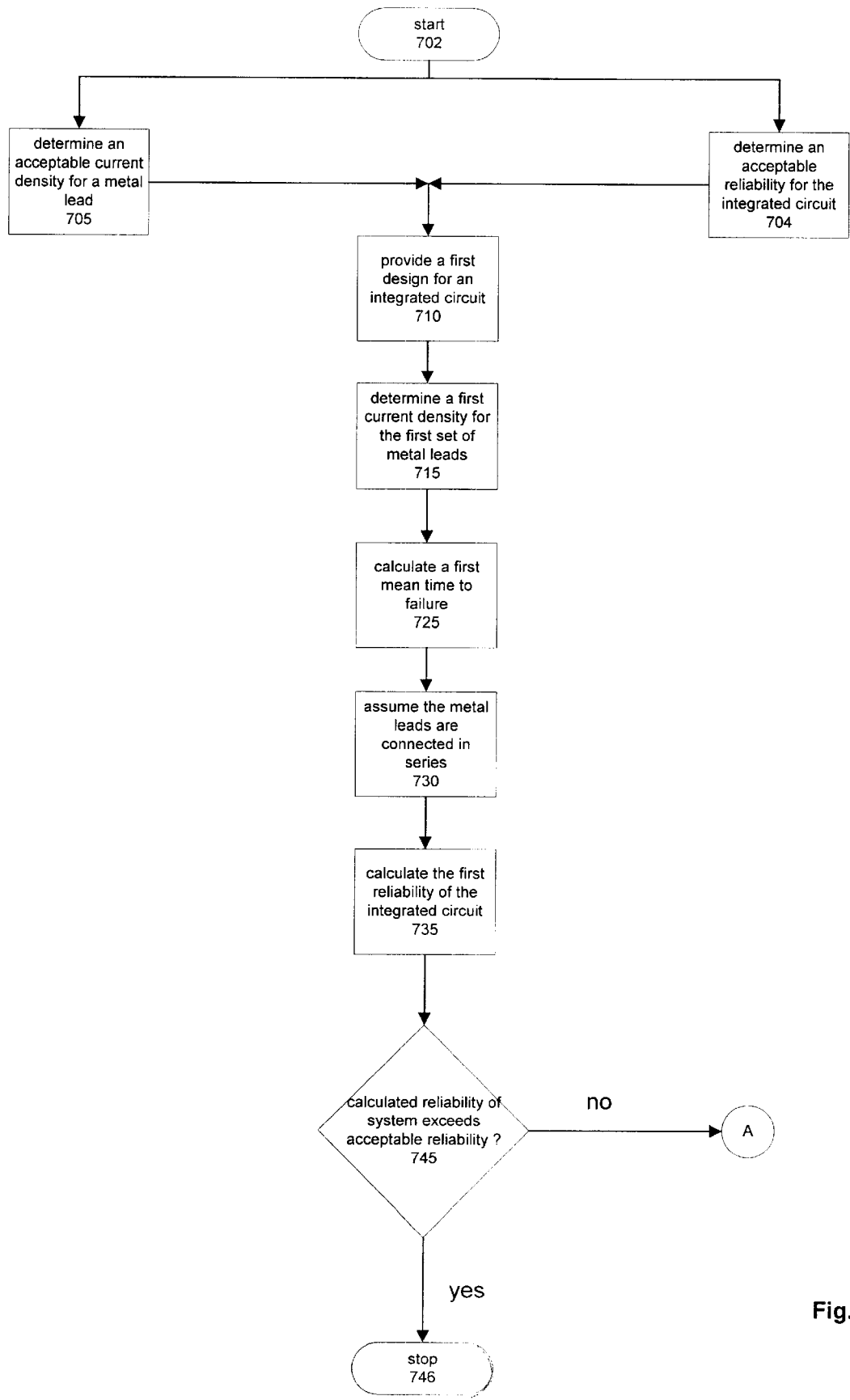
FIGS. 7A–7D depict flow charts of embodiments of the disclosure.
Figure 7B:
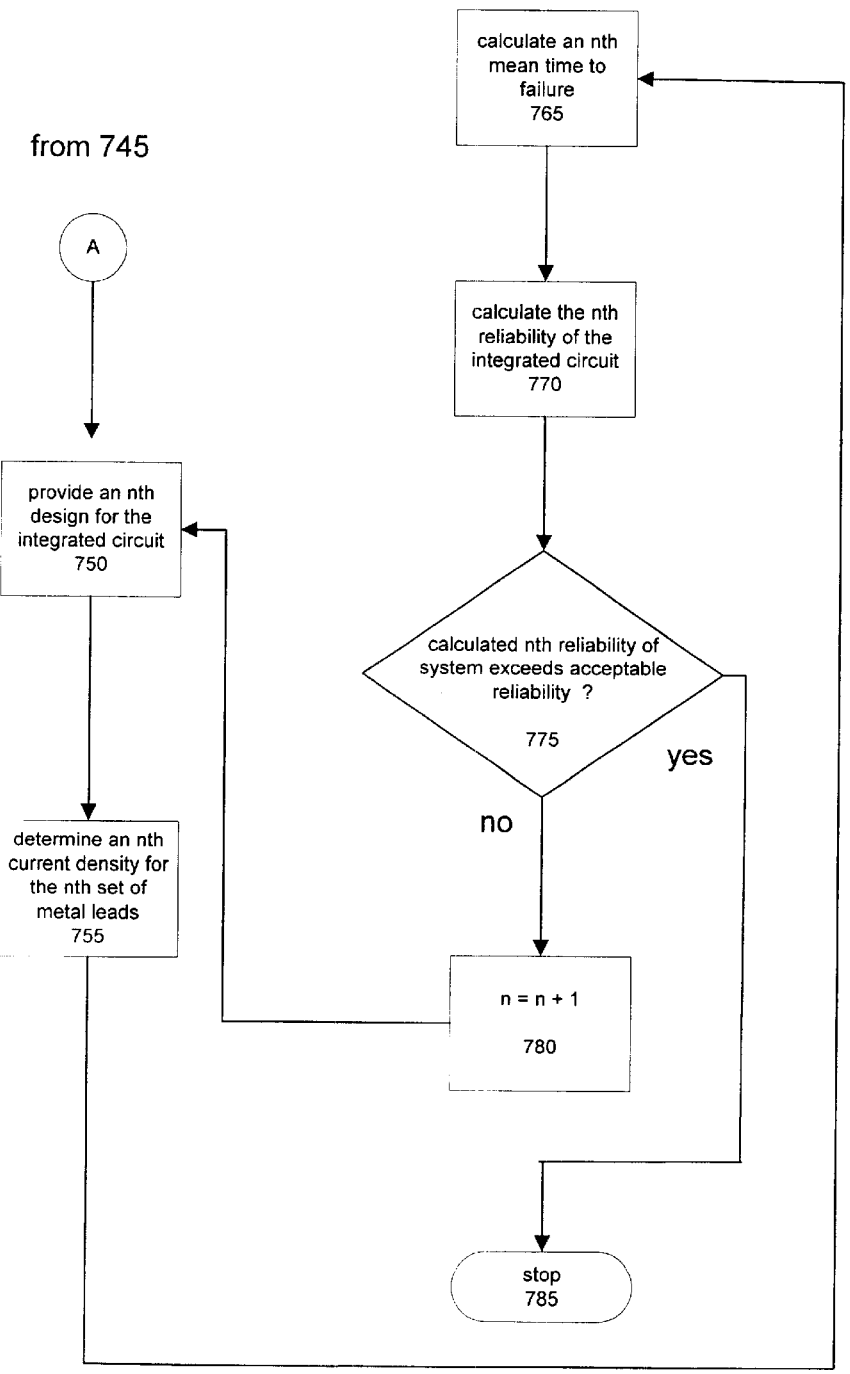
Figure 7C:
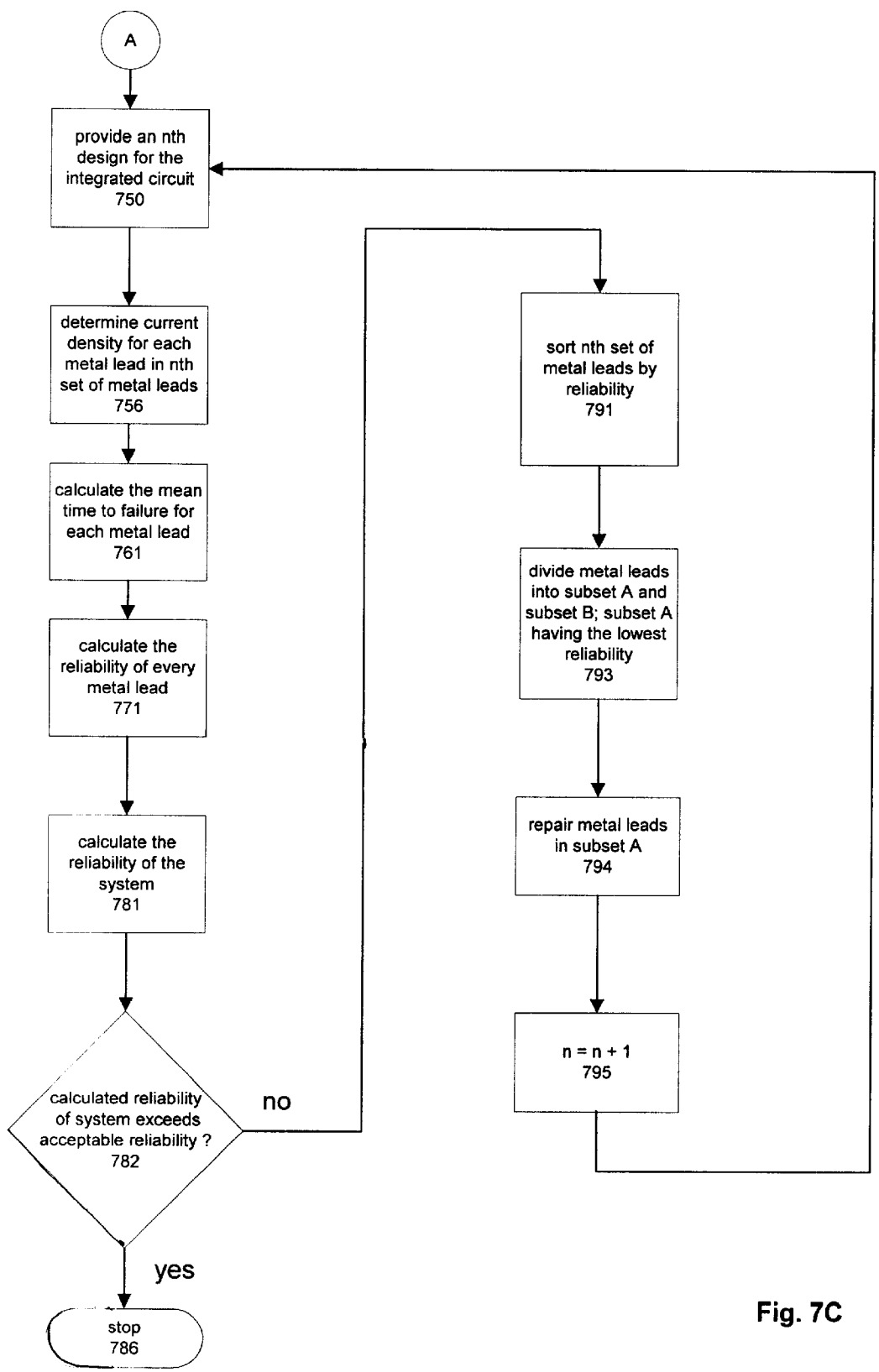

From step 720, the method calculates a (first) mean time to failure, step 725. It is assumed that the metal leads are connected in series, step 730. Step 730 is depicted as sequential to step 725 but a method according to this embodiment of the present invention should not be limited to such a configuration. Step 730 can occur anytime before the (first) reliability of the integrated circuit is calculated, step 735. After step 735, the method proceeds to decision 745. Decision 745 determines if the reliability of the system exceeds the acceptable reliability. If the reliability of the system exceeds the acceptable reliability, the method stops, step 746. If the reliability of the system is less than the acceptable reliability, the method proceeds as shown in FIG. 7B or FIG. 7C.

In one embodiment, the method proceeds from step 745 to prove an $n^{th}$ design for the integrated circuit, step 750. In one embodiment, metal leads with higher-than acceptable current density are redesigned to reduce the current density in the iterative design. After the $n^{th}$ design is completed, the method proceeds to determine an $n^{th}$ current density for the $n^{th}$ set of metal leads, step 755.

From step 755, the method calculates the $n^{th}$ mean time to failure, 765. The $n^{th}$ mean time to failure corresponds to the mean time to failure of the metal leads corresponding to the $n^{th}$ design. From step 765 the method calculates the reliability of the integrated circuit, step 770. From step 770, the method determines if the $n^{th}$ reliability of the system exceeds the acceptable reliability, step 775. If the $n^{th}$ reliability of the integrated circuit exceeds the acceptable reliability, the method can stop, step 785. If the $n^{th}$ reliability of the system is less than the acceptable reliability of the system, the counter is incremented and the method proceeds to step 750. Step 750 is an earlier step in the method, hence the embodiment air depicted in FIG. 7B is an iterative process.

In one alternative embodiment, the method again proceeds from step 745 (previously shown in FIG. 7A) to provide an $n^{th}$ design for the integrated circuit, step 750. A determination is then made to the current density for each metal lead in the $n^{th}$ set of metal leads, step 756. (In one embodiment, determining the current density in the $n^{th}$ set of metal leads includes determining the current density of each metal lead in the $n^{th}$ design.) From step 756 the method proceeds to calculate the mean time to failure for each metal lead, step 761. From step 761 the method proceeds to calculate the reliability of each metal lead, 771. From step 771, the method proceeds to calculate the reliability of the system, step 781.

From step 781, the method determines of the calculated reliability of the system exceeds the acceptable reliability, step 782. The acceptable reliability of the system was previously determined in step 704. If the calculated reliability of the system exceeds the acceptable reliability, the method stops, step 786. If the calculated reliability of the system is less than the acceptable reliability, the method continues.

From step 782 (also referred to as decision 782), the method proceeds to sort the $n^{th}$ set of metal leads by reliability, step 791. The set of metal leads can be sorted in ascending or descending order. Typically, the set of metal leads is sorted in descending order. From step 791, the method divides the (previously sorted) set of metal leads into at least two subsets; subset A and subset B. One subset includes the metal leads of lowest reliability. For convenience, the subset including the metal leads of lowest reliability is referred to herein as subset A.

From step 793, the method proceeds to repair metal leads in subset A. Typically, repair of metal leads involves redesign of the integrated circuit to widen the metal leads. From step 794, the method proceeds to increment the counter, step 795. Any logical counter can be used. In this instance index "n" (also referred to as a "logical counter" is used for convenience. Incrementing the logical counter allows the method to proceed in an iterative loop within previously determined constraints. For example, an analyst may decide to allow the loop (as shown in FIG. 7C) to proceed for only 100 iterations by stopping the method when n equals one hundred. In another instance, the analyst can decide to allow the method to continue for a greater number of iterations. From step 795, the method continues to step 750. It will be noted that step 750 has been previously performed by the method, thus the method can be said to be "circular" or iterative.

Figure 7D:
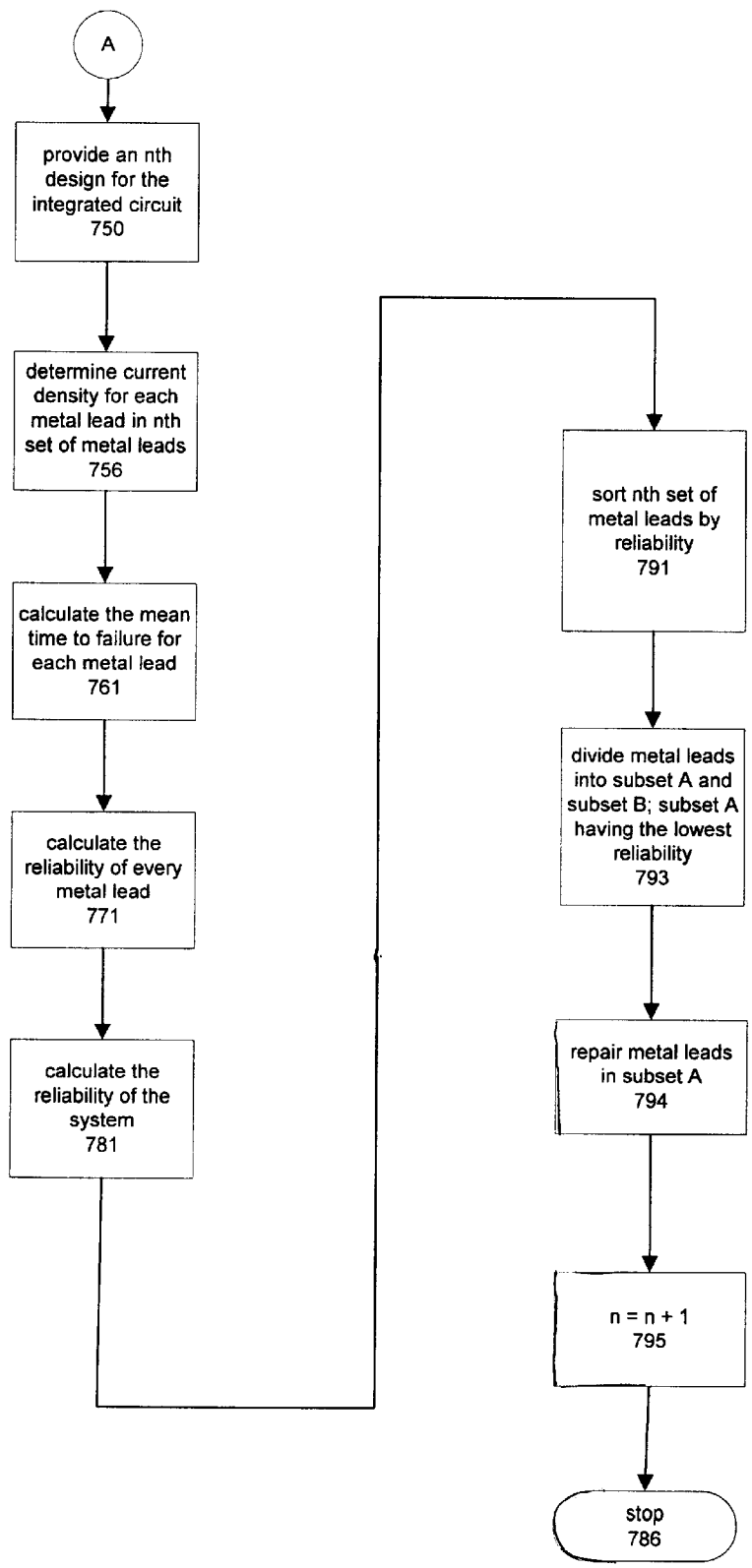

In yet another alternative embodiment, the method can be performed without iteration. In this embodiment (shown in FIG. 7D), steps 782 and 795 are omitted. Other steps (for example, steps 781, 791, 793 and 794) are as previously described. However, the method is performed in only one pass, as shown in FIG. 7D. Thus, the method is not limited to iteration. Equation 10, below, shows a method of performing the method in a single pass, without iteration.

$$R_{req} \leq R(t) = R_j(t)^{j-1} \pi_{i=j}^N R_i(t) \qquad \text{Equation 10}$$

Figure 8A:
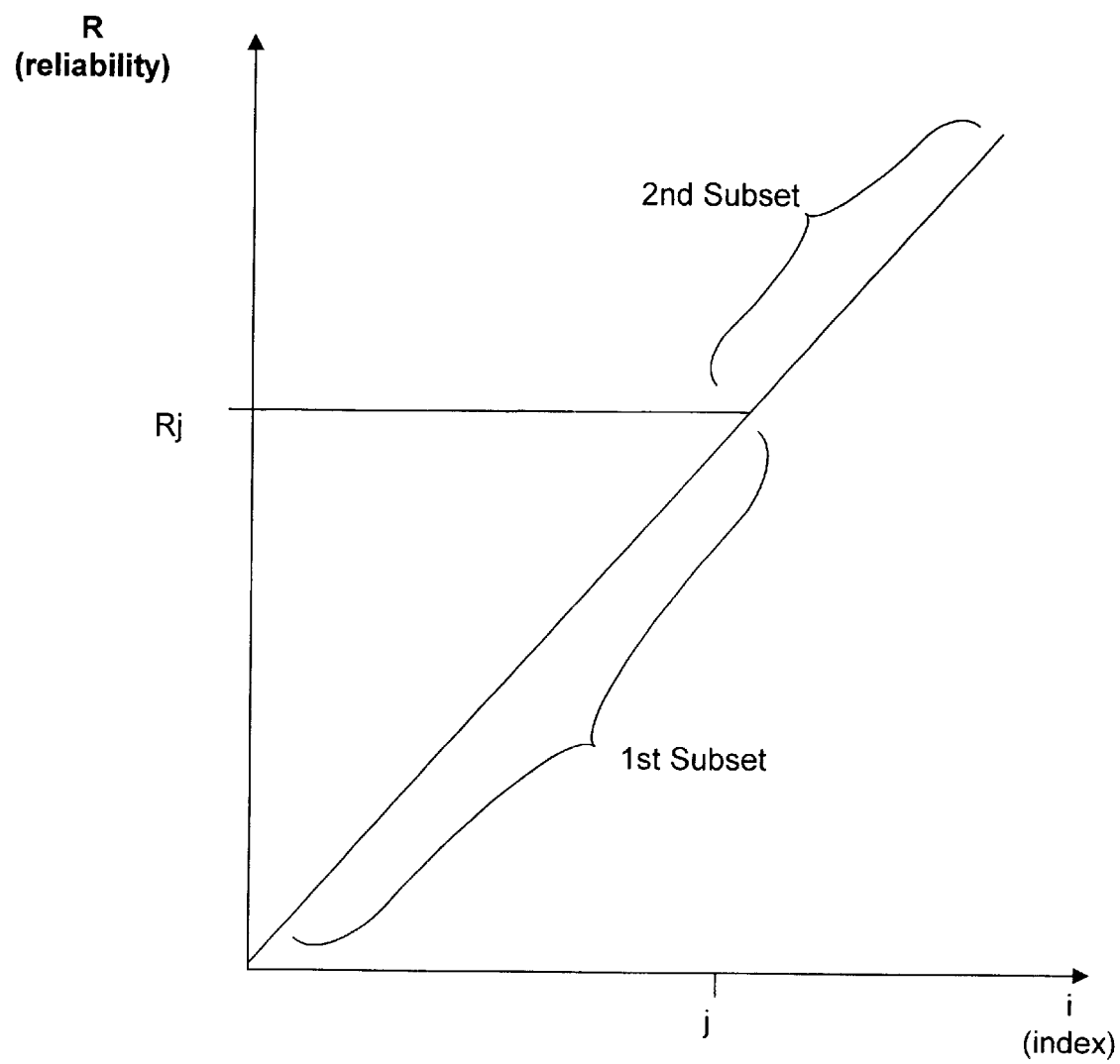
FIG. 8A depicts a plot of a set of interconnects having an index and a reliability.

Referring to FIG. 8A, a plot is shown of reliability (R) on the X axis and index on the Y axis. It will be recalled, that the index (denoted in this case by subscript i) is used to identify the reliability of the individual metal leads. After calculating the reliability of each metal lead the set of metal leads is sorted by reliability. In one enablement of the invention, the set of metal leads are sorted from lowest reliability to highest. Each metal lead is assigned an index number; the index number is a sequential number incremented by one. Thus, an index number can be used to find the previously calculated reliability of a corresponding metal lead. Equations 3(c), 3(d) and 4(b) are used to calculate the individual reliability of metal leads.

Figure 8B:
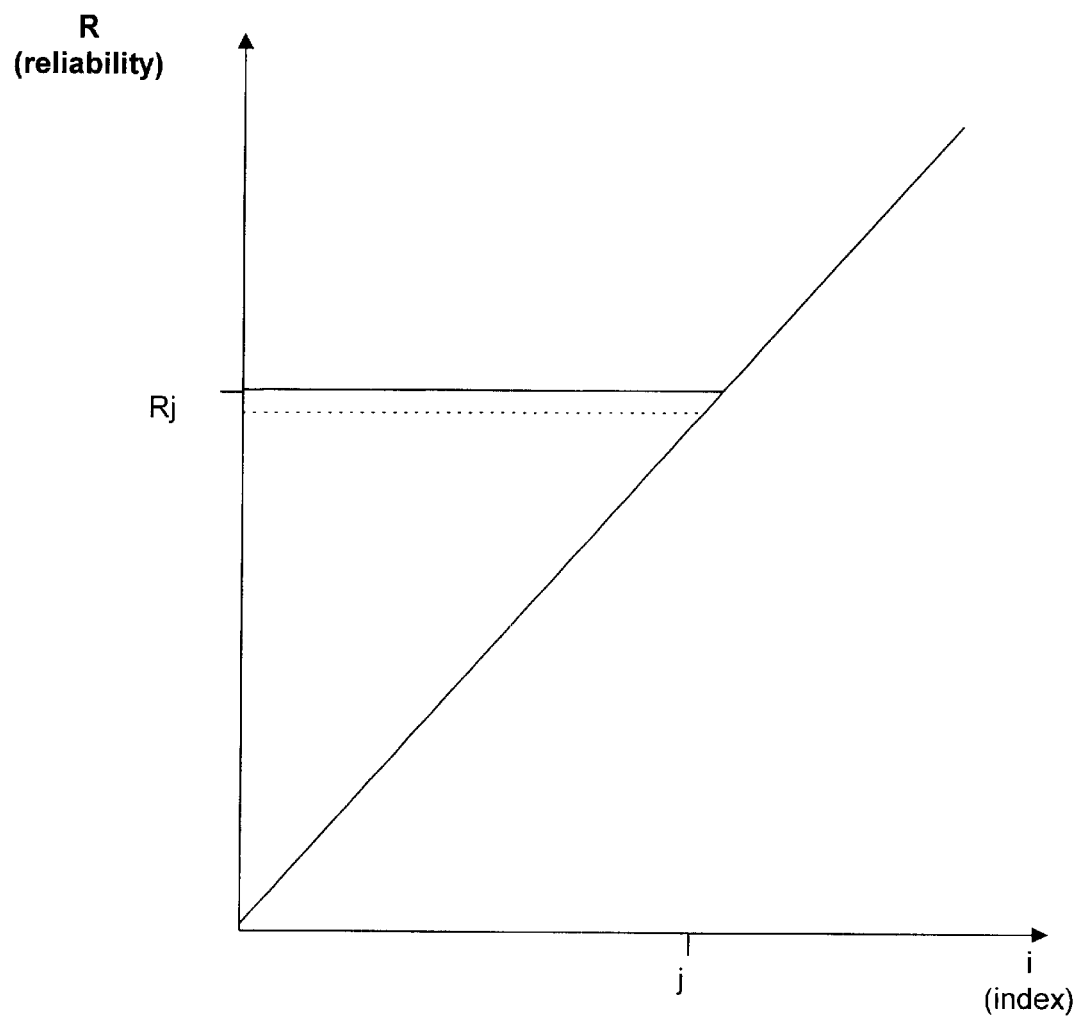
FIG. 8B depicts a plot of the set of interconnects as shown in FIG. 8A with an incremental change in the index.

Referring now to FIGS. 8A and 8B, a metal lead is chosen arbitrarily. Assuming a metal lead corresponding to index j is chosen; the corresponding reliability of the metal lead is known as identified as $R_j$ in FIGS. 8A and 8B. The next step in the sequence is to define the reliability of all interconnects in the first subset having a reliability of less than $R_j$ equal to the reliability of $R_j$. The reliability of the system is calculated again. If the reliability of the system exceeds the acceptable reliability then only those metal leads having an index of j or less must be repaired in order to meet the specified system reliability. As shown in FIG. 8B, index j can be decreased until the calculated reliability of the system is approximately equal to the acceptable reliability.

If the reliability of the system is less than the desired reliability, then j is increased incrementally. In this manner, again, the minimum number of metal leads to be repaired is determined. In one embodiment of the method, for illustrative purposes only, it is assumed that the number of metal leads in a system is one million. Now referring to FIG. 8B, index i will range from one to one million. Now, again for illustrative purposes assume the reliability of the metal leads ranges from 0.10 to 0.99. Thus, R in FIG. 8B will range from 0.10 to 0.99, or more. Subsequently, it is assumed that the metal lead corresponding to a reliability of 0.10 is initially chosen as the dividing point. Thus, the metal lead corresponding to 0.10 has an index of j. Thus, all metal leads having an index less than j have a reliability less than 0.10. All metal leads having an index greater than j have a reliability greater than 0.10.

In the example of the preceding paragraph, the reliability of each metal lead with an index greater than j is held constant. It is assumed that reliability of each metal lead with an index of less than j equals the reliability of metal lead with index j. Thus, in effect, it is assumed that the reliability of all metal leads in the first subset equals the lowest reliability of the metal leads in the second subset. Now calculate the reliability of the system. If the reliability of the system exceeds the acceptable reliability only those metal leads in the first subset (or fewer) must be repaired to meet the minimum system reliability. If the reliability of the system is less than the acceptable reliability, increase j by an increment and again calculate the reliability of the system. Thus, in an incremental method the minimum number of metal leads to be repaired can be determined.

The method disclosed is not restricted to a specific software, software language or software architecture. Each of the steps of the method disclosed may be performed by a module (e.g., a software module) or a portion of a module executing on a computer system. Thus, the above component organization may be executed on a desk top computer system or other data processing system. The method may be embodied in a machine-readable and/or computer-readable medium for configuring a computer system to execute the method. Thus, the software modules may be stored within and/or transmitted to a computer system memory to configure the computer system to perform the functions of the module.

The operations described above and modules therefor may be executed on a computer system configured to execute the operations of the method and/or may be executed from computer-readable media. The method may be embodied in a machine-readable and/or computer-readable medium for configuring a computer system to execute the method.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims.

What is claimed is:

1. A method of designing an integrated circuit, comprising:
    calculating a current density for each metal lead in an $n^{th}$ design of an integrated circuit, the $n^{th}$ design of the integrated circuit comprising an $n^{th}$ set of metal leads;
    calculating a mean time to failure for each metal lead in a first set of metal leads;
        wherein the mean time to failure is a function of the current density;
    calculating a reliability of each metal lead in the first set of metal leads;
    calculating a first reliability of the integrated circuit wherein the first set of metal leads are connected in series, wherein due to the series connection the failure of one metal lead of the $n^{th}$ set of metal leads causes the integrated circuit to fail, wherein calculating a first reliability of the integrated circuit is based on the mean time to failure for each set of metal leads and wherein calculating a first reliability of the integrated circuit is based on calculating a reliability of each metal lead in the first set of metal leads; and
    arranging the $n^{th}$ set of metal leads by reliability, wherein arranging the $n^{th}$ set of metal leads by reliability allows calculation of a number of metal leads to be redesigned.

2. The method of designing an integrated circuit as recited in claim 1, further comprising:
    calculating a minimum number of metal leads to repair to satisfy a predetermined reliability of the integrated circuit.

3. The method of designing an integrated circuit as recited in claim 1, further comprising:
    dividing the $n^{th}$ set of metal leads into a plurality of subsets, the plurality of subsets comprising:
    a first subset; and
    a second subset, wherein the lowest reliability of the metal leads contained in the second subset is greater than the highest reliability of the metal leads contained in the first subset.

4. The method of designing an integrated circuit as recited in claim 3, further comprising:
    providing an $n^{th}+1$ design based on repairing a first metal lead in the first subset, wherein repairing a first metal lead in the first subset includes reducing the current density of a metal lead included in the first subset.

5. The method of designing an integrated circuit as recited in claim 3, further comprising:
    sorting the metal leads in the $n^{th}$ design, the metal leads in the $n^{th}$ design sorted by reliability; wherein ascending order places a first metal lead with a first reliability having a first index; a second metal lead with a second reliability having a second index wherein the first reliability is less than the second reliability and the first index is less than the second index, wherein the reliability of metal lead in the second subset is sufficient to meet a predetermined reliability of a system, wherein the reliability of a metal lead in the second subset is constant and wherein the reliability of the metal leads in the first subset is less than the reliability sufficient to meet a predetermined reliability of a system.

6. The method of designing an integrated circuit as recited in claim 5, further comprising:
    increasing incrementally the reliability of the first metal lead and the second metal lead in the first subset until the reliability of the integrated circuit is greater than or equal to a predetermined reliability, wherein a first metal lead and a second metal lead in the second subset have equal reliability.

7. The method of designing an integrated circuit as recited in claim 6, further comprising:
    calculating a mean time to failure of first subset of metal leads.

8. The method of designing an integrated circuit as recited in claim 7, further comprising:
    calculating the amount by which to widen the metal leads in the first subset to meet a predetermined reliability of the integrated circuit.

9. An integrated circuit designed by a method, the method comprising:
    calculating a current density for each metal lead in an $n^{th}$ design for the integrated circuit, wherein the $n^{th}$ design of the integrated circuit comprises an $n^{th}$ set of metal leads;
    calculating a mean time to failure for each metal lead in the first set of metal leads;
        wherein the mean time to failure is a function of the current density;
    calculating a reliability of each metal lead in the first set of metal leads, where in the first set of metal leads are connected in series, wherein due to the series connection the failure of one metal lead of the $n^{th}$ set of metal leads causes the integrated circuit to fail;
    calculating a first reliability of the integrated circuit; and
    arranging the $n^{th}$ set of metal leads by reliability, wherein arranging the $n^{th}$ set of metal leads by reliability allows calculation of a number of metal leads to be redesigned.

10. The integrated circuit as recited in claim 9, the method further comprising:
    calculating a minimum number of metal leads to repair to satisfy a predetermined reliability of the integrated circuit.

11. The integrated circuit as recited in claim 9, the method further comprising:
    dividing the $n^{th}$ set of metal leads into a plurality of subsets, the plurality of subsets comprising:

a first subset; and a second subset, wherein the lowest reliability of the metal leads contained in the second subset is greater than the highest reliability of the metal leads contained in the first subset.

12. The integrated circuit as recited in claim 11, the method further comprising:

providing an $n^{th}+1$ design based on repairing a first metal lead in the first subset, wherein repairing a first metal lead in the first subset includes reducing the current density of a metal lead included in the first subset.

13. The integrated circuit as recited in claim 11, the method further comprising:

sorting the metal leads in the $n^{th}$ design, the metal leads in the $n^{th}$ design sorted by reliability; wherein ascending order places a first metal lead with a first reliability having a first index; and a second metal lead with a second reliability having a second index wherein the first reliability is less than the second reliability and the first index is less than the second index, wherein the reliability of a metal lead in the second subset is sufficient to meet a predetermined reliability of a system, wherein the reliability of a metal lead in the second subset is constant and wherein the reliability of a metal lead in the first subset is less than the reliability sufficient to meet a predetermined reliability of the integrated circuit.

14. The integrated circuit as recited in claim 13, the method further comprising:

increasing incrementally the reliability of the first metal lead and the second metal lead in the first subset until the reliability of the integrated circuit is greater than or equal to a predetermined reliability, wherein a first metal lead and a second metal lead in the second subset have equal reliability.

15. The integrated circuit as recited in claim 14, the method further comprising:

calculating a mean time to failure of first subset of metal leads.

16. The integrated circuit as recited in claim 15, the method further comprising:

calculating the amount by which to widen a metal lead in the first subset to meet a predetermined reliability of the integrated circuit.

17. An integrated circuit designed by a computer program product encoded in computer readable media, the computer program product comprising:

a set of instructions, the set of instructions configured to:
provide an $n^{th}$ design for the integrated circuit, the $n^{th}$ design of the integrated circuit comprising an $n^{th}$ set of metal leads;
calculate a current density for each metal lead in the $n^{th}$ set of metal leads;
calculate a mean time to failure for each metal lead in the first set of metal leads, wherein the mean time to failure is a function of the current density;
calculate a reliability of each metal lead in the first set of metal leads;
calculate a first reliability of the integrated circuit, wherein the first set of metal leads are connected in series, wherein due to the series connection the failure of one metal lead of the $n^{th}$ set of metal leads causes the integrated circuit to fail; and
arrange the $n^{th}$ set of metal leads by reliability, wherein arranging the $n^{th}$ set of metal leads by reliability allows calculation of a number of metal leads to be redesigned.

18. The integrated circuit as recited in claim 17, the computer program product further comprising:

a set of instructions, the set of instructions configured to:
calculate a minimum number of metal leads to repair to satisfy a predetermined reliability of the integrated circuit.

19. The integrated circuit as recited in claim 17, the computer program product further comprising:

a set of instructions, the set of instructions configured to:
divide the $n^{th}$ set of metal leads into a plurality of subsets, the plurality of subsets comprising:
a first subset; and
a second subset, wherein the lowest reliability of the metal leads contained in the second subset is greater than the highest reliability of the metal leads contained in the first subset.

20. The integrated circuit as recited in claim 19, the computer program product further comprising:

a set of instructions, the set of instructions configured to:
provide an $n^{th}+1$ design based on repairing a first metal lead in the first subset, wherein repairing a first metal lead in the first subset includes reducing the current density of a metal lead included in the first subset.

21. The integrated circuit as recited in claim 19, the computer program product further comprising:

a set of instructions, the set of instructions configured to:
sort the metal leads in the $n^{th}$ design, the metal leads in the $n^{th}$ design sorted by reliability; wherein ascending order places a first metal lead with a first reliability having a first index, wherein a second metal lead with a second reliability having a second index wherein the first reliability is less than the second reliability and the first index is less than the second index, wherein the reliability of metal lead in the second subset is sufficient to meet a predetermined reliability of a system; further assuming the reliability of a metal lead in the second subset is constant, and wherein the reliability of the metal leads in the first subset is less than the reliability sufficient to meet a predetermined reliability of a system.

22. The integrated circuit as recited in claim 21, the computer program product further comprising:

a set of instructions, the set of instructions configured to:
increase incrementally the reliability of the first metal lead and the second metal lead in the first subset until the reliability of the integrated circuit is greater than or equal to a predetermined reliability, wherein a first metal lead and a second metal lead in the second subset have equal reliability.

23. The integrated circuit as recited in claim 22, the computer program product further comprising:

a set of instructions, the set of instructions configured to:
calculate a mean time to failure of first subset of metal leads.

24. The integrated circuit as recited in claim 23, the computer program product further comprising:

a set of instructions, the set of instructions configured to:
calculate the amount by which to widen a metal lead in the first subset to meet a predetermined reliability of the integrated circuit.

25. A computer program product used to design an integrated circuit, the computer program product encoded in computer readable media, the computer program product comprising:

a set of instructions, the set of instructions configured to:
calculate a current density for an $n^{th}$ design for the integrated circuit, the $n^{th}$ design of the integrated circuit comprising an $n^{th}$ set of metal leads;

calculate a mean time to failure for each metal lead in the first set of metal leads, wherein the mean time to failure is a function of the current density;

calculate a reliability of each metal lead in the first set of metal leads;

calculate a first reliability of the integrated circuit, wherein the first set of metal leads are connected in series, wherein due to the series connection the failure of one metal lead of the $n^{th}$ set of metal leads causes the integrated circuit to fail; and arrange the $n^{th}$ set of metal leads by reliability, wherein arranging the $n^{th}$ set of metal leads by reliability allows calculation of a number of metal leads to be redesigned.

26. The computer program product as recited in claim 25, further comprising:

a set of instructions, the set of instructions configured to: calculate a minimum number of metal leads to repair to satisfy a predetermined reliability of the integrated circuit.

27. The computer program product as recited in claim 25, further comprising:

a set of instructions, the set of instructions configured to: divide the $n^{th}$ set of metal leads into a plurality of subsets, the plurality of subsets comprising:
a first subset; and
a second subset, wherein the lowest reliability of the metal leads contained in the second subset is greater than the highest reliability of the metal leads contained in the first subset.

28. The computer program product as recited in claim 27, further comprising:

a set of instructions, the set of instructions configured to: provide an $n^{th}+1$ design based on repairing a first metal lead in the first subset, wherein repairing a first metal lead in the first subset includes reducing the current density of a metal lead included in the first subset.

29. The computer program product as recited in claim 27, further comprising:

a set of instructions, the set of instructions configured to: sort the metal leads in the $n^{th}$ design, the metal leads in the $n^{th}$ design sorted by reliability; wherein ascending order places a first metal lead with a first reliability having a first index; and a second metal lead with a second reliability having a second index wherein the first reliability is less than the second reliability and the first index is less than the second index, wherein the reliability of metal lead in the second subset is sufficient to meet a predetermined reliability of a system, wherein the reliability of a metal lead in the second subset is constant and wherein the reliability of the metal leads in the first subset is less than the reliability sufficient to meet a predetermined reliability of a system.

30. The computer program product as recited in claim 29, further comprising:

a set of instructions, the set of instructions configured to: increase incrementally the reliability of the first metal lead and the second metal lead in the first subset until the reliability of the integrated circuit is greater than or equal to a predetermined reliability wherein a first metal lead and a second metal lead in the second subset have equal reliability.

31. A computer program product as recited in claim 30, further comprising:

a set of instructions, the set of instructions configured to: calculate a mean time to failure of first subset of metal leads.

32. A computer program product as recited in claim 31, further comprising:

a set of instructions, the set of instructions configured to: calculate the amount by which to widen a metal lead in the first subset to meet a predetermined reliability of the integrated circuit.

33. A computer system, comprising:

a processor;

a memory operably coupled to the processor; and a set of instructions encoded in a computer readable media, configured to:

calculate a current density for each metal lead in an $n^{th}$ design of an integrated circuit, the $n^{th}$ design of the integrated circuit comprising an $n^{th}$ set of metal leads;

calculate a mean time to failure for each metal lead in the first set of metal leads, wherein the mean time to failure is a function of the current density;

calculate a reliability of each metal lead in the first set of metal leads;

calculate a first reliability of the integrated circuit wherein the first set of metal leads are connected in series, wherein due to the series connection the failure of one metal lead of the $n^{th}$ set of metal leads causes the integrated circuit to fail, wherein calculating a first reliability of the integrated circuit is based on the mean time to failure for each set of metal leads and wherein calculating a first reliability of the integrated circuit is based on calculating a reliability of each metal lead in the first set of metal leads; and arrange the $n^{th}$ set of metal leads by reliability, wherein arranging the $n^{th}$ set of metal leads by reliability allows calculation of a number of metal leads to be redesigned.

34. The computer system as recited in claim 33, further comprising:

a set of instructions encoded in a computer readable media, configured to calculate a minimum number of metal leads to repair to satisfy a predetermined reliability of the integrated circuit.

35. The computer system as recited in claim 33, further comprising:

a set of instructions encoded in computer readable media, configured to divide the $n^{th}$ set of metal leads into a plurality of subsets, the plurality of subsets comprising:
a first subset; and
a second subset, wherein the lowest reliability of the metal leads contained in the second subset is greater than the highest reliability of the metal leads contained in the first subset.

36. The computer system as recited in claim 35, further comprising:

a set of instructions encoded in a computer readable media configured to provide an $n^{th}+1$ design based on repairing a first metal lead in the first subset, wherein repairing a first metal lead in the first subset includes reducing the current density of a metal lead included in the first subset.

37. The computer system as recited in claim 35, further comprising:

a set of instructions encoded in a computer readable media configured to sort the metal leads in the $n^{th}$ design, the metal leads in the $n^{th}$ design sorted by reliability; wherein ascending order places a first metal lead with a first reliability having a first index; and a second metal lead with a second reliability having a second index wherein the first reliability is less than the second reliability and the first index is less than the second index, wherein the reliability of metal lead in the second subset is sufficient to meet a predetermined reliability of a system, wherein the reliability of a metal lead in the second subset is constant and wherein the reliability of the metal leads in the first subset is less than the reliability sufficient to meet a predetermined reliability of a system.

38. The computer system as recited in claim 37, further comprising:
a set of instructions encoded in a computer readable media configured to increase incrementally the reliability of the first metal lead and the second metal lead in the first subset until the reliability of the integrated circuit is greater than or equal to a predetermined reliability, wherein a first metal lead and a second metal lead in the second subset have equal reliability.

39. The computer system as recited in claim 38, further comprising:
a set of instructions encoded in computer readable media configured to calculate a mean time to failure of first subset of metal leads.

40. The computer system as recited in claim 39, further comprising:
a set of instructions encoded in computer readable media configured to calculate the amount by which to widen the metal leads in the first subset to meet a predetermined reliability of the integrated circuit.

41. A system to design an integrated circuit, the system, comprising:
means to calculate a current density for each metal lead in an $n^{th}$ design of an integrated circuit, the $n^{th}$ design of the integrated circuit comprising an $n^{th}$ set of metal leads;
means to calculate a mean time to failure for each metal lead in the first set of metal leads; wherein the mean time to failure is a function of the current density;
means to calculate a reliability of each metal lead in the first set of metal leads;
means to calculate a first reliability of the integrated circuit wherein the first set of metal leads are connected in series, wherein due to the series connection the failure of one metal lead of the $n^{th}$ set of metal leads causes the integrated circuit to fail, wherein calculating a first reliability of the integrated circuit is based on the mean time to failure for each set of metal leads and wherein calculating a first reliability of the integrated circuit is based on calculating a reliability of each metal lead in the first set of metal leads; and
means to arrange the $n^{th}$ set of metal leads by reliability, wherein arranging the $n^{th}$ set of metal leads by reliability allows calculation of a number of metal leads to be redesigned.

42. The system as recited in claim 41, further comprising:
means to calculate a minimum number of metal leads to repair to satisfy a predetermined reliability of the integrated circuit.

43. The system as recited in claim 41, further comprising:
means to divide the $n^{th}$ set of metal leads into a plurality of subsets, the plurality of subsets comprising:
a first subset; and
a second subset, wherein the lowest reliability of the metal leads contained in the second subset is greater than the highest reliability of the metal leads contained in the first subset.

44. The system as recited in claim 43, further comprising:
means to provide an $n^{th}+1$ design based on repairing a first metal lead in the first subset, wherein repairing a first metal lead in the first subset includes reducing the current density of a metal lead included in the first subset.

45. The system as recited in claim 43, further comprising:
means to sort the metal leads in the $n^{th}$ design, the metal leads in the $n^{th}$ design sorted by reliability; wherein ascending order places a first metal lead with a first reliability having a first index; and a second metal lead with a second reliability having a second index wherein the first reliability is less than the second reliability and the first index is less than the second index, wherein the reliability of metal lead in the second subset is sufficient to meet a predetermined reliability of a system, wherein the reliability of a metal lead in the second subset is constant and wherein the reliability of the metal leads in the first subset is less than the reliability sufficient to meet a predetermined reliability of a system.

46. The system as recited in claim 45, further comprising:
means to increase incrementally the reliability of the first metal lead and the second metal lead in the first subset until the reliability of the integrated circuit is greater than or equal to a predetermined reliability, wherein a first metal lead and a second metal lead in the second subset have equal reliability.

47. The system as recited in claim 46, further comprising:
means to calculate a mean time to failure of first subset of metal leads.

48. The system as recited in claim 47, further comprising:
means to calculate the amount by which to widen the metal leads in the first subset to meet a predetermined reliability of the integrated circuit.

* * * * *